United States Patent
Yi et al.

(10) Patent No.: US 8,118,906 B2
(45) Date of Patent: Feb. 21, 2012

(54) METHODOLOGY FOR RECYCLING RU AND RU-ALLOY DEPOSITION TARGETS AND TARGETS MADE OF RECYCLED RU AND RU-BASED ALLOY POWDERS

(75) Inventors: Wuwen Yi, Tempe, AZ (US); William Heckman, Montague, MI (US); Bernd Kunkel, Phoenix, AZ (US); Carl Derrington, Tempe, AZ (US); Patrick Griffin, Chandler, AZ (US)

(73) Assignee: Heraeus Inc., Chandler, AZ (US)

( * ) Notice: Subject to any disclaimer, the term of this patent is extended or adjusted under 35 U.S.C. 154(b) by 1100 days.

(21) Appl. No.: 11/927,325

(22) Filed: Oct. 29, 2007

(65) Prior Publication Data
US 2009/0107837 A1      Apr. 30, 2009

(51) Int. Cl.
B22F 9/04  (2006.01)

(52) U.S. Cl. .............. 75/354; 75/369; 75/631; 148/513; 148/678

(58) Field of Classification Search .......................... None
See application file for complete search history.

(56) References Cited

U.S. PATENT DOCUMENTS

| | | | | |
|---|---|---|---|---|
| 6,036,741 A * | 3/2000 | Shindo et al. | ............... | 75/10.28 |
| 6,071,323 A | 6/2000 | Kawaguchi et al. | | |
| 6,077,983 A * | 6/2000 | Ono et al. | .................... | 585/269 |
| 6,635,219 B2 | 10/2003 | Wen et al. | | |
| 2002/0130041 A1 | 9/2002 | Jyh-Chung et al. | | |
| 2005/0066774 A1 | 3/2005 | Asano et al. | | |
| 2005/0279637 A1 * | 12/2005 | Pinter et al. | .................... | 205/78 |

FOREIGN PATENT DOCUMENTS

| | | |
|---|---|---|
| DE | 199 22 144 | 11/1999 |
| EP | 1 066 899 | 7/2000 |
| EP | 1 026 283 | 8/2000 |
| EP | 1 066 899 A2 | 1/2001 |
| JP | 05-247641 | 9/1993 |
| JP | 06-158300 | 6/1994 |
| JP | 09-227965 | 9/1997 |
| JP | 11-328648 | 11/1999 |
| JP | 2002-327265 | 11/2002 |
| JP | 2002-332528 | 11/2002 |
| JP | 2002-332528 A | 11/2002 |
| JP | 2004-225091 | 8/2004 |

OTHER PUBLICATIONS

Office Action and translation of Chinese Application No. 200810083606.0 dated Nov. 23, 2011, 3 pages.

\* cited by examiner

*Primary Examiner* — George Wyszomierski
(74) *Attorney, Agent, or Firm* — McDermott Will & Emery LLP

(57) ABSTRACT

A method of recycling ruthenium (Ru) and Ru-based alloys comprises steps of: providing a solid body of Ru or a Ru-based alloy; segmenting the body to form a particulate material; removing contaminants, including Fe, from the particulate material; reducing the sizes of the particulate material to form a powder material; removing contaminants, including Fe, from the powder material; reducing oxygen content of the powder material to below a predetermined level to form a purified powder material; and removing particles greater than a predetermined size from the purified powder material. The purified powder material may be utilized for forming deposition sources, e.g., sputtering targets.

18 Claims, 1 Drawing Sheet

# METHODOLOGY FOR RECYCLING RU AND RU-ALLOY DEPOSITION TARGETS AND TARGETS MADE OF RECYCLED RU AND RU-BASED ALLOY POWDERS

FIELD OF THE DISCLOSURE

The present disclosure generally relates to methodology for recycling ruthenium (Ru) and Ru-based alloy materials and to products made from the recycled Ru and Ru-based alloy materials. The disclosure has particular utility in recycling of Ru and Ru-based alloy deposition targets, e.g., sputtering targets, and to targets made from powders of the recycled Ru and Ru-based alloy materials.

BACKGROUND OF THE DISCLOSURE

Ruthenium and ruthenium-based alloy materials are increasingly utilized in the manufacture of a number of advanced technology products, e.g., as coupling layers in high performance, high areal recording density anti-ferromagnetically coupled ("AFC") magnetic recording media and as adhesion/seed layers in copper-based "back-end" metallization systems of high integration density semiconductor integrated circuit ("IC") devices. Such layers are typically formed by sputter deposition processing, e.g., magnetron sputtering, utilizing Ru or Ru-based alloy targets. However, use of the sputtering targets in a given application is limited due to consumption of the target over time, primarily because of concern of target penetration due to irregular or uneven (i.e., local) sputtering over the target surface. Economic considerations arising from the high cost of Ru and Ru-based alloys dictate recovery of these materials from spent targets.

Conventional methodology for recycling Ru and Ru-based alloy materials, e.g., from spent targets, typically involves chemical refining processing. However, such chemical refining processing incurs a number of disadvantages, including:

- extremely long processing intervals, e.g., on the order of about 12 weeks;
- high cost;
- porous and highly agglomerated nature of the recycled product, rendering it undesirable for use in subsequent fabrication of new targets; and
- relatively low tap density of the recycled product powder, i.e., about 4.0 gm/cc on average, necessitating increase in the packing density prior to target formation.

In view of the foregoing, there exists a clear need for improved, more cost effective methodology for recycling Ru and Ru-based alloy materials for facilitating re-use thereof, e.g., as in the manufacture of Ru and Ru-based deposition targets (such as sputtering targets) using recycled materials.

Further, there exists a clear need for improved, cost-effective deposition targets comprising recycled Ru and Ru-based alloy materials.

SUMMARY OF THE DISCLOSURE

An advantage of the present disclosure is an improved method of recycling ruthenium (Ru) and Ru-based alloys.

Another advantage of the present disclosure is an improved method of forming Ru and Ru-based alloy deposition sources, e.g., sputtering targets, from spent sources.

Yet another advantage of the present disclosure is improved Ru and Ru-based alloy deposition sources, e.g., sputtering targets, fabricated from Ru and Ru-based alloy powders derived from spent deposition sources.

Additional advantages and features of the present disclosure will be set forth in the disclosure which follows and in part will become apparent to those having ordinary skill in the art upon examination of the following or may be learned from the practice of the present disclosure. The advantages may be realized and obtained as particularly pointed out in the appended claims.

According to an aspect of the present disclosure, the foregoing and other advantages are achieved in part by an improved method of recycling ruthenium (Ru) and Ru-based alloys, comprising steps of:

(a) providing a solid body of Ru or a Ru-based alloy;
(b) segmenting the solid body to form a particulate material;
(c) removing contaminants, including iron (Fe), from the particulate material;
(d) reducing the particle sizes of the particulate material to form a powder material;
(e) removing contaminants, including Fe, from the powder material;
(f) reducing oxygen content of the powder material to below a predetermined level to form a purified powder material; and
(g) removing particles greater than a predetermined size from the purified powder material.

According to embodiments of the present disclosure, step (a) comprises providing a solid body in the form of a spent deposition source, e.g., a sputtering target, and the method further comprises a step of:

(h) forming a deposition source, e.g., a sputtering target, from the purified powder material.

Embodiments of the present disclosure include those wherein step (h) comprises consolidating the purified powder to have a tap density >~5 gm/cm$^3$; and step (h) comprises hot isostatic pressing ("HIP"), vacuum hot pressing, or spark plasma sintering, and optionally further comprises cold isostatic pressing ("CIP").

Further embodiments of the present disclosure include those wherein step (h) comprises addition of a predetermined amount of at least one element to the purified powder prior to consolidating, e.g., as when step (a) comprises providing a solid body of a RuCr alloy; and step (h) comprises adding a predetermined amount of chromium (Cr) to the purified powder.

According to embodiments of the present disclosure, step (b) comprises optional jaw crushing followed by hammer milling; step (c) comprises a first leaching to remove iron (Fe) and other contaminants, followed by drying; step (d) comprises impact milling; step (e) comprises a second leaching to reduce Fe content to <~500 ppm and remove other contaminants, followed by drying, and further comprises performing a magnetic separation to remove Fe prior to the second leaching; step (f) comprises reducing oxygen content to <~500 ppm, as by performing a reduction process in an atmosphere containing hydrogen gas and annealing the purified powder material during the reduction process.

Preferably, step (e) comprises reducing Fe content to <~500 ppm; and step (f) comprises reducing oxygen content <~500 ppm.

Another aspect of the present disclosure is recycled Ru or Ru-based alloys made by the above process, e.g., powder materials having a desired mesh size, e.g., 325 mesh, and tap density >~5 gm/cm$^3$.

Still another aspect of the present invention is Ru and Ru alloy-based deposition sources, e.g., Ru and RuCr sputtering targets, fabricated from the powder material formed by the above process, with densities comparable to those of Ru and Ru-based sources/targets fabricated from virgin Ru and RuCr powder material and hardness greater than those of Ru and Ru-based sources/targets fabricated from virgin Ru and RuCr powder material.

Additional advantages and aspects of the present disclosure will become readily apparent to those skilled in the art from the following detailed description, wherein only the preferred embodiments of the present disclosure are shown and described, simply by way of illustration of the best mode contemplated for practicing the present disclosure. As will be realized, the disclosure is capable of other and different embodiments, and its several details are capable of modification in various obvious respects, all without departing from the spirit of the present disclosure. Accordingly, the drawing and description are to be regarded as illustrative in nature, and not as restrictive.

BRIEF DESCRIPTION OF THE DRAWING

The following detailed description of the embodiments of the present disclosure can best be understood when read in conjunction with the following drawing, in which.

DETAILED DESCRIPTION OF THE DISCLOSURE

Figure 1:
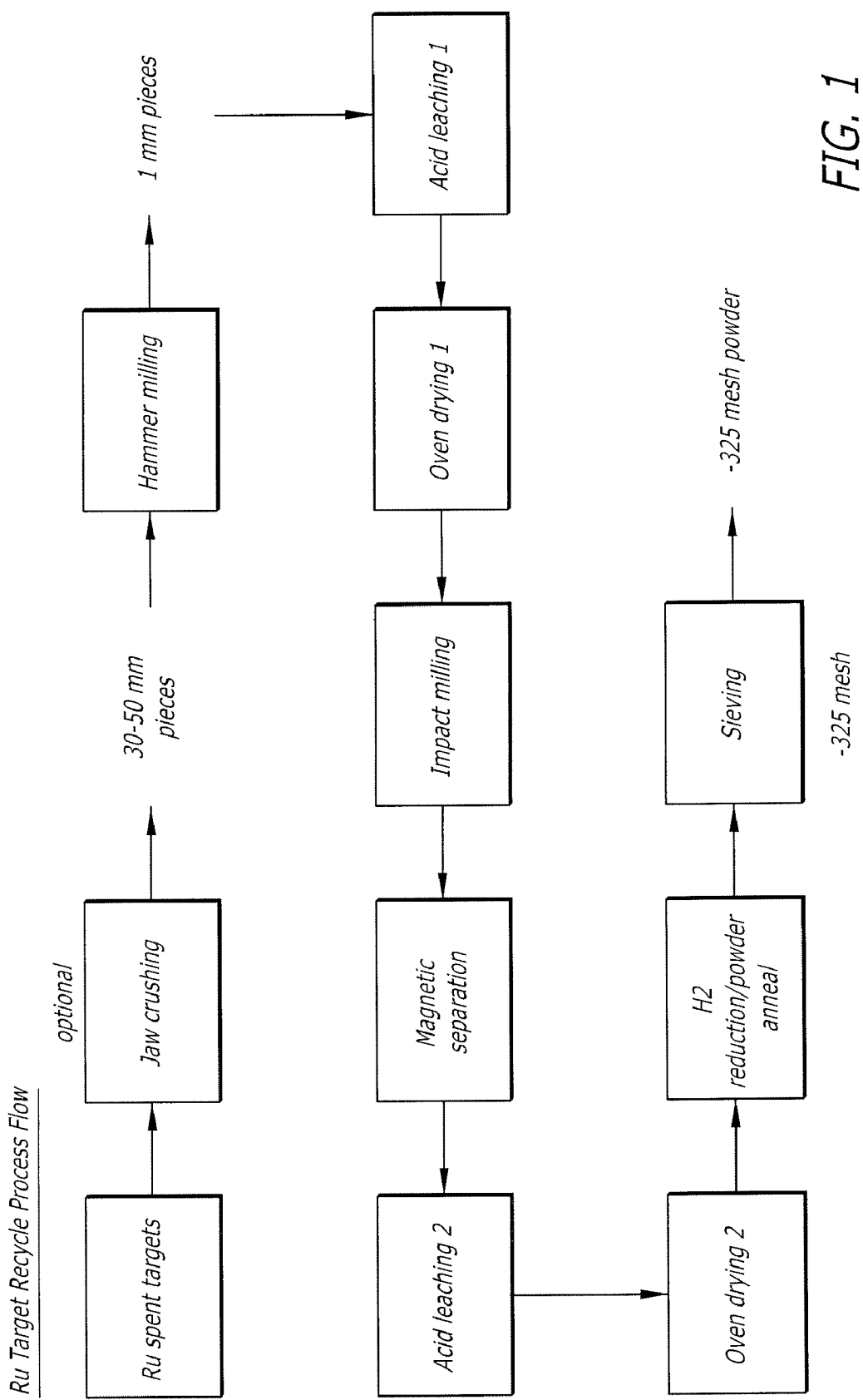
FIG. 1 is a flow chart schematically showing an illustrative, but non-limitative embodiment according to the present disclosure.

The present invention addresses and effectively solves, or at least mitigates, several problems and/or disadvantages associated with conventional chemical-based methodology for recycling products/apparatus containing Ru and Ru-based alloy materials, e.g., thin film deposition sources such as sputtering targets, and is based upon discovery that recovery/recycling of Ru and Ru-based alloy materials can be formed in an efficient, cost-effective manner which substantially reduces the processing interval.

More specifically, the presently disclosed methodology overcomes the following disadvantages associated with conventional chemical refining processing for Ru recovery/recycling, including the high cost; extremely long processing intervals, e.g., on the order of about 12 weeks; the porous and highly agglomerated nature of the recycled product, rendering it undesirable for use in subsequent fabrication of new deposition sources, such as sputtering targets; and the relatively low tap density of the recycled product powder, i.e., about 4.0 gm/cm$^3$ on average, necessitating increase in the packing density prior to target formation.

The improved methodology for Ru recovery/recycling will now be described in detail with reference to FIG. 1, which is a flow chart schematically showing an illustrative, but non-limitative, embodiment according to the present disclosure wherein spent sputtering targets are subjected to a recycling process for recovering high purity Ru and Ru-based alloy materials for re-use in the manufacture of new sputtering targets.

In a first step according to the process methodology, a solid body of Ru or Ru-based alloy material, i.e., a spent sputtering target is provided and mechanically segmented into appropriately sized particles, illustratively 1 mm (~0.04 in) pieces. Mechanical segmentation may, if desired, be accomplished via a 2-stage process comprising an initial jaw crushing step to form pieces in the 30-50 mm (~1-2 in.) size range, followed by hammer milling to form smaller pieces in the 1 mm (~0.04 in) size range.

According to the next step of the process methodology, the smaller pieces are subjected to a first leaching, e.g., with a strong mineral acid such as hydrochloric (HCl) or nitric (HNO$_3$) acid, at room temperature for from about 12 to about 48 hrs., in order to remove contaminants from the pieces, especially any iron (Fe) introduced during the segmentation process. The leached particles are then subjected to a first oven drying, and impact milled to form a powder material with about 325 mesh size.

The powder material is then subjected to a second leaching, e.g., with a strong mineral acid such as hydrochloric (HCl) or nitric (HNO$_3$) acid, at room temperature for from about 12 to about 48 hrs., to further remove contaminants, followed by a second oven drying. The Fe content of the dried powder after the second leaching should be very low, i.e., <500 ppm, in order to prevent, or at least limit, diffusion of any Fe present on the surfaces of the powder particles into the interior thereof during subsequent processing, e.g., hydrogen reduction. In this regard, it should be recognized that any Fe present in the interior of the powder particles is difficult to remove, e.g., by leaching.

According to the next step of the instant process methodology, the dried powder from the second leaching step is subjected to reduction in a hydrogen (H$_2$) gas atmosphere at about 1,000° C. for about 12 hrs., to reduce oxygen content of the powder to below a desired level, typically <500 ppm. An advantageous feature of the present methodology annealing of the powder during the hydrogen reduction process, whereby any work hardening of the material incurred during the earlier segmentation processing is reduced. The feature of annealing during hydrogen reduction is critical for facilitating subsequent consolidation of the recycled powder.

The resultant purified powder is then sieved through a mesh screen, e.g., 325 mesh, to remove oversize particles and yield purified recycled Ru or Ru-based alloy powder material.

The purified recycled Ru or Ru-based alloy material can be utilized, inter alia, for making Ru and Ru-based alloy deposition sources, e.g., sputtering targets. In the case of recycled RuCr powder, Cr may be added thereto according to the desired final composition of the deposition source.

According to methodology afforded by the instant disclosure, the recycled purified Ru or Ru-based alloy powder is subjected to consolidation processing, which may include optional CIP followed by HIP, vacuum hot pressing, or spark plasma sintering to achieve full density. In this regard, whereas CIP is required for chemically recycled Ru or Ru-based alloy powder because of its low tap density (<5 gm/cm$^3$), CIP of recycled Ru or Ru-based alloy powder formed according to the present methodology is not necessarily required in view of its higher tap density (>5 gm./cm$^3$).

Ru and Ru alloy-based deposition sources, e.g., Ru and RuCr sputtering targets, fabricated from the powder material formed by the above process by conventional powder metallurgical techniques, have densities comparable to those of Ru and Ru-based sources/targets fabricated from virgin Ru and RuCr powder material and hardness greater than those of Ru and Ru-based sources/targets fabricated from virgin Ru and RuCr powder material.

Recycled Ru and Ru-based alloys, and products fabricated therefrom, such as deposition sources (e.g., sputtering targets), have reduced Fe content of <~500 ppm and reduced oxygen content <~500 ppm.

In summary, advantages afforded by the present methodology include:

1. the total recycling time is about 2 weeks, which is only about 17% of the recycling time required by the conventional chemical recycling process (i.e., about 12 weeks);

2. recycling cost is significantly less expensive than that of the conventional chemical recycling process;

3. the recycled powder is non-porous and not agglomerated, whereas the recycled powder produced by the conventional chemical recycling process is porous and highly agglomerated. In this regard, agglomerated powder is not preferred for use in deposition source (e.g., sputtering target) manufacture via powder metallurgical techniques; and 4. The recycled powder produced by the present process has a high average tap density $>\sim 5$ gm/cm$^3$ (as compared with an average tap density of only about 4 gm/cm$^3$ with powder produced via conventional chemical recycling), thereby facilitating formation of deposition sources via powder metallurgical techniques not requiring a CIP step to increase tap density. As a consequence, the present methodology affords further cost and processing time reductions.

In the previous description, numerous specific details are set forth, such as specific materials, structures, processes, etc., in order to provide a better understanding of the present invention. However, the present invention, can be practiced without resorting to the details specifically set forth herein. In other instances, well-known processing techniques and structures have not been described in order not to unnecessarily obscure the present invention.

Only the preferred embodiments of the present invention and but a few examples of its versatility are shown and described in the present disclosure. It is to be understood that the present invention is capable of use in various other combinations and environments and is susceptible of changes and/or modifications within the scope of the inventive concept as expressed herein.

What is claimed is:

1. A method of recycling ruthenium (Ru) and Ru-based alloys, comprising steps of:
   (a) providing a solid body of Ru or a Ru-based alloy;
   (b) segmenting said solid body to form a particulate material;
   (c) removing contaminants, including iron (Fe), from said particulate material;
   (d) reducing particle sizes of said particulate material to form a powder material;
   (e) removing contaminants, including Fe, from said powder material;
   (f) reducing oxygen content of said powder material to form a purified powder material; and
   (g) removing particles greater than a predetermined size from said purified powder material.

2. The method according to claim 1, wherein:
step (a) comprises providing a solid body in the form of a spent deposition source.

3. The method according to claim 2, wherein:
said spent deposition source comprises a sputtering target.

4. The method according to claim 2, further comprising a step of:
   (h) forming a deposition source from said purified powder material.

5. The method according to claim 4, wherein:
said deposition source comprises a sputtering target.

6. The method according to claim 4, wherein:
step (h) comprises consolidating said purified powder to have a tap density $>\sim 5$ gm/cm$^3$.

7. The method according to claim 6, wherein:
step (h) comprises hot isostatic pressing, vacuum hot pressing, or spark plasma sintering and optionally further comprises cold isostatic pressing.

8. The method according to claim 6, wherein:
step (h) comprises addition of at least one element to said purified powder prior to said consolidating.

9. The method according to claim 8, wherein:
step (a) comprises providing a solid body of a RuCr alloy; and
step (h) comprises adding chromium (Cr) to said purified powder.

10. The method according to claim 1, wherein:
step (b) comprises optional jaw crushing followed by hammer milling.

11. The method according to claim 1, wherein:
step (c) comprises a first leaching to remove iron (Fe) and other contaminants, followed by drying.

12. The method according to claim 1, wherein:
step (d) comprises impact milling.

13. The method according to claim 1, wherein:
step (e) comprises a second leaching to reduce Fe content to $<\sim 500$ ppm and remove other contaminants, followed by drying.

14. The method according to claim 13, wherein:
step (e) further comprises performing a magnetic separation to remove Fe prior to said second leaching.

15. The method according to claim 1, wherein:
step (f) comprises reducing oxygen content to $<\sim 500$ ppm.

16. The method according to claim 15, wherein:
step (f) comprises performing a reduction process in an atmosphere containing hydrogen gas.

17. The method according to claim 16, wherein:
step (f) further comprises annealing said purified powder material during said reduction process.

18. The method according to claim 1, wherein:
step (e) comprises reducing Fe content to $<\sim 500$ ppm; and
step (f) comprises reducing oxygen content $<\sim 500$ ppm.

* * * * *